(12) United States Patent
Gödl et al.

(10) Patent No.: US 6,972,832 B1  
(45) Date of Patent: Dec. 6, 2005

(54) METHOD OF GROUNDING A PHOTOBLANK TO A HOLDING DEVICE

(75) Inventors: Gernot Gödl, Ismaning (DE); Andreas Oelmann, Forstinning (DE); Gerd Unger, München (DE); Wolfgang Besenböck, München (DE); Alois Reiter, München (DE)

(73) Assignee: Infineon Technologies AG, Munich (DE)

( * ) Notice: Subject to any disclaimer, the term of this patent is extended or adjusted under 35 U.S.C. 154(b) by 827 days.

(21) Appl. No.: 09/660,899

(22) Filed: Sep. 13, 2000

Related U.S. Application Data

(63) Continuation of application No. PCT/DE99/00675, filed on Mar. 11, 1999.

(30) Foreign Application Priority Data

Mar. 13, 1998 (DE) .................................. 198 11 081

(51) Int. Cl.⁷ .................. G03B 27/62; G03B 27/32; G03F 9/00; G21G 5/00
(52) U.S. Cl. ................ 355/75; 355/77; 430/5; 250/492.2
(58) Field of Search ............... 355/77, 75; 430/5; 250/492.1, 492.2; 269/304, 305

(56) References Cited

U.S. PATENT DOCUMENTS 5,843,623 A * 12/1998 Pinckney .................. 430/296

FOREIGN PATENT DOCUMENTS

| JP | 63 221 617 A | 9/1988 |
| JP | 01 187 296 A | 7/1989 |
| JP | 01 217 349 A | 8/1989 |
| JP | 2-030 047 | * 1/1990 |
| JP | 02 125 416 A | 5/1990 |
| JP | 02 125 607 | 5/1990 |
| JP | 3-263 814 | * 11/1991 |
| JP | 03 263 814 A | 11/1991 |
| JP | 04 353 848 A | 12/1992 |
| JP | 4-353848 | * 12/1992 |

* cited by examiner

Primary Examiner—Alan Mathews  
(74) Attorney, Agent, or Firm—Laurence A. Green; Werner H. Stemer

(57) ABSTRACT

A retaining device for photo blanks, comprising a retaining member (1) with a supporting surface (3) for a photo blank (4) and a ground element (10) which can be brought into contact with an electroconductive layer (6) of said photo blank. The ground element is provided with a contact tip (15) which can be manipulated in such a way that it can be lowered substantially onto the photo blank (4) without any lateral movement in relation to said photo blank which is inserted into the retaining device.

10 Claims, 2 Drawing Sheets

METHOD OF GROUNDING A PHOTOBLANK TO A HOLDING DEVICE

CROSS-REFERENCE TO RELATED APPLICATION

This is a continuation of copending International Application PCT/DE99/00675, filed Mar. 11, 1999, which designated the United States.

BACKGROUND OF THE INVENTION

Field of the Invention

The invention relates to a method of fixing and grounding a photoblank in a holding device.

During the manufacture of photomasks for photolithographic processes, so-called photoblanks are used as the starting material. These photoblanks are polished quartz plates which are coated with a layer of chromium and a layer of photoresist applied above the chromium layer. The photoblank is irradiated with an electron beam in an electron-beam writer. The desired mask pattern is thereby transferred to the photoblank. During this irradiation, the photoblank must be grounded. Otherwise, static charges can be formed in the area of its surface and influence the electron beam in an undesired way as it is drawing the pattern.

It has been known, heretofore, in order to ground the photoblank, to use a grounding spring which is applied to the cassette in which the photoblank is inserted during irradiation. When the photoblank is loaded into the cassette, the photoblank is pushed under the grounding spring, the spring making electrical contact with the chromium layer, destroying the photoresist layer and the chromium layer locally. In this case, the fact that the destruction of these layers leads to the formation of particles is disadvantageous. These particles can lead to the covering or distortion of the electron beam, which results in the formation of chromium islands (chromium spots) and the occurrence of positional errors. Repairing such faulty masks is possible only with a considerable outlay, or it is even impossible. While chromium spots which have occurred can be removed by means of evaporation with the aid of a laser beam in repair systems conceived specifically for the purpose, although there is a high risk of damage to adjacent structures, the positional errors effected by distortion of the electron beam are irreparable.

A further disadvantage of the conventional grounding springs is that it is not infrequent for an undefined electrical contact to occur, which can result in poor grounding. This also leads to erroneous positioning of the electron beam and therefore to an irreparable mask defect.

SUMMARY OF THE INVENTION

It is accordingly an object of the invention to provide a method for grounding photoblanks in a holding device, which overcomes the above-mentioned disadvantages of the heretofore-known devices and methods of this general type and which enables the manufacture of a high yield of masks without faults, and which method results in an increase in the yield of defect-free masks during manufacture.

With the foregoing and other objects in view there is provided, in accordance with the invention, a method of grounding a photoblank provided with an electrically conductive layer in a holding device, which comprises:

positioning the photoblank on a supporting surface of a holding device;

providing a leaf spring with a contact-making tip mounted thereon;

lowering the contact-making tip onto a surface of the photoblank in a controlled manner with a position-adjusting element, which is connected to the leaf spring and forms an adjustable stop on the holding device, by adjusting the position-adjusting element by a defined amount, whereby the contact-making tip is lowered onto the surface of the photoblank and penetrates the surface with a predetermined impressing pressure.

In accordance with an added feature of the invention, prior to mounting the leaf spring on the holding device, the position-adjusting element is turned sufficiently far into a threaded hole formed in the leaf spring for securing a spacing.

With the above and other objects in view there is also provided, in accordance with the invention, a method of grounding a photoblank provided with an electrically conductive layer in a holding device, which comprises:

positioning a photoblank on a supporting surface of a holding device;

providing a leaf spring with a contact-making tip fitted thereto;

mounting and prepositioning a position-adjusting element on the leaf spring for forming an adjustable stop on the holding device;

holding the leaf spring away from the surface of the photoblank with an element other than the position-adjusting element; and subsequently to positioning the photoblank, lowering the leaf spring onto the photoblank controlled manner;

whereby a final-position travel is predefined by the pre-positioned position-adjusting element.

In accordance with an additional feature of the invention, the position-adjusting element is a setting screw.

In accordance with another feature of the invention, a position of the photoblank is fixed with one or more hold-downs fitted to the holding device and the photoblank is clamped firmly with pressure on the surface of the photoblank.

In accordance with a further feature of the invention, in an unstressed state, the leaf spring is formed with a bend at which a longitudinal extent of the leaf spring deviates by an angle α from a rectilinear course. In a preferred embodiment, the angle α is between 2° and 15°.

As a result of avoiding any lateral relative movement between the contact-making tip and the photoblank as the tip is brought down, the flaking of constituents of the layer, and therefore undesired particle formation, is largely ruled out as the tip is placed onto the surface layers of the photoblank and penetrates into them. The formation of the grounding contact is carried out by impressing the tip into a surface-layer area of the photoblank with little damage, any "scratching" at the surface being avoided.

A further significant advantage of the invention resides in the fact that the grounding element according to the invention brings about the defined and reliable formation of an electrical contact, and therefore constantly good grounding.

According to a preferred embodiment of the invention, the grounding element is formed as a leaf spring which can be fixed at its one end to the holding body and is provided at its other end with the contact-making spring. In this case, an advantageous design variant is distinguished by the fact that, in the unstressed state, the leaf spring has a bend at which the longitudinal extent of the leaf spring deviates by an angle α from a straight course. In this case, given a suitable selection of the angle α, the dimensioning of the leaf spring and a suitable material selection, the spring characteristic of the leaf spring can be set as desired.

In addition, a position-adjusting element is expediently fitted to the leaf spring and forms an adjustable stop on the holding device. In this way, the stroke of the contact-making tip over the photoblank can be predefined in a defined way, and it is also possible to monitor the action of bringing the tip down by actuating the positioning element.

The contact-making tip is preferably formed from a hard material with a good electrical conductivity, in particular a hard metal. As a result, high freedom from wear and dimensional stability of the tip, as well as a low electrical resistance of the same, are ensured.

According to a preferred design variant, the contact-making tip is designed as a polygonal tip, in which at least one edge is a cutting edge. As a result, on the one hand relatively large-area contact-making areas are available between the edges, as a result of which the electrical contact resistance can be kept low and the reproducibility of the same is also increased. On the other hand, as a result of the cutting edge being sharp, the cutting penetration of the tip into the surface layers is guaranteed, which considerably reduces the risk of layer components flaking away as a result of the lateral displacement of material.

Although, in principle, a single grounding element already provides grounding which is adequate in practice, the provision of a number of grounding elements increases the grounding reliability further, and also achieves redundancy with regard to grounding failures.

As noted above, it is preferred for the photoblank to first be fixed in its end position on the holding device, and for the contact-making tip of the grounding element to be subsequently brought down essentially in the direction normal to the plane of the supporting surface.

Other features which are considered as characteristic for the invention are set forth in the appended claims.

Although the invention is illustrated and described herein as embodied in a holding device for photoblanks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3b is a plan view of the leaf spring of FIG. 3a;

FIG. 4b is a side view of the tip section of the grounding spring shown in FIG. 4a.

DESCRIPTION OF THE PREFERRED EMBODIMENTS

Figure 1:
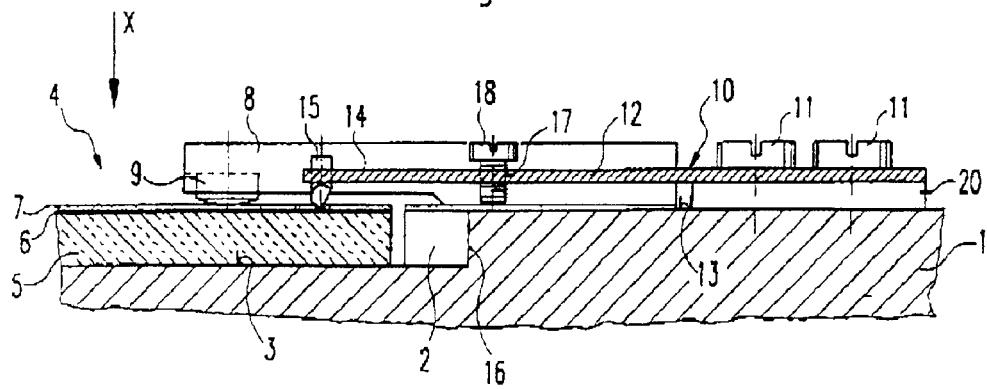
FIG. 1 is a partial sectional view of a cassette having an inserted photoblank and applied grounding spring with leaf spring and contact-making tip.

Referring now to the figures of the drawing in detail and first, particularly, to FIG. 1 thereof, there is shown a cassette for holding a photoblank in a mask-generating system (electron-beam writer MEBES) having a holding plate 1 formed with a central depression 2 or recess. The surface of the central depression 2 forms a supporting surface 3 for a photoblank 4. The photoblank 4 comprises a polished quartz plate 5, to the surface of which a metal layer about 100 nm thick, for example a chromium layer 6, and a photoresist layer 7 about 400 nm thick arranged above the first have been applied. A arrow X shows the direction in which an electron beam is directed onto the photoblank 4 in order to generate a mask.

The photoblank 4 is fixed in position by means of a hold-down 8 fixed to the holding plate 1, by being pressed onto the supporting surface 3. For this purpose, the hold-down 8 has, at its end remote from the holding plate, a dome-like fixing element 9, which can consist of sapphire, for example, and forms an essentially point-like contact area with the surface of the photoblank 4.

A number of such hold-downs 8 can be provided on the holding plate 1. The illustration is limited to one for purposes of clarity.

A grounding spring 10 is provided for the purpose of making electrical contact between the chromium layer 6 of the photoblank 4 and the holding plate 1. The grounding spring 10 essentially comprises a leaf spring 12, which is firmly fixed mechanically and with good electrical contact with the metallic holding plate 1 by two screw connections 11. The leaf spring 12 extends essentially parallel to the surface 13 of the holding plate 1 and, at its free end 14, projects beyond the central depression 2 of the holding plate 1. Fitted to the free end 14 is a contact-making tip 15 which, for example, can be formed in a cone shape or, as illustrated in FIG. 1, as a polygonal tip. The tip 15 is in good electrical contact with the chromium layer 6. As a result, the chromium layer 6 is connected to the ground potential of the holding plate 1 via the grounding spring 10.

In the vicinity of a step formation 16 belonging to the central depression 2, the leaf spring 12 is also provided with a threaded hole 17, into which a Teflon-coated setting screw 18 is screwed. The setting screw 18 rests with its threaded end on the surface 13 of the holding plate 1, so that the height of the contact-making tip 15 over the surface of the quartz plate 5 can be set very precisely via the rotational position of the setting screw 18.

Figure 2:
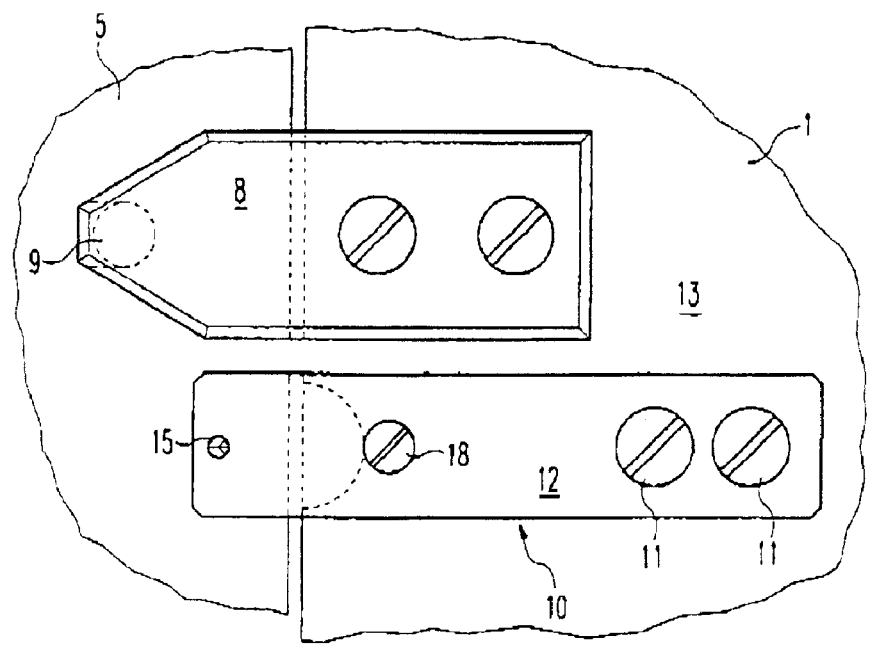
FIG. 2 is a top plan view of the configuration of in FIG. 1.

FIG. 2 shows the holding device illustrated in FIG. 1 in plan view. Although the hold-down 8 and the grounding spring 10 are arranged adjacent to each other here, it is likewise possible to provide these elements at a greater distance from each other.

The functional operation of the holding device according to the invention is as follows:

First, the photoblank 4 is inserted into the depression 2 in the holding plate 1. For this purpose, both the hold-down 8 and the grounding spring 10 have previously been dismantled from the holding plate 1, so that the depression 2 is freely accessible. After the insertion of the photoblank 4, the latter is fixed in its position relative to the holding plate 1 by means of mounting the hold-down 8. The photoblank 4 is then grounded by fitting the grounding spring 10. For this purpose, the leaf spring 12 is firmly screwed to the holding plate 1 or to a spacer base 20 provided on the holding plate 1, via the two screw connections 11. Care is thereby taken that the contact-making tip 15 does not yet come into contact with the surface of the photoblank 4 at this point in time. This can be ensured, for example, in that before the mounting, the setting screw 18 is screwed sufficiently far into the threaded hole 17 to ensure the spacing. Another possibility is to utilize the elasticity of the leaf spring 12 and to keep the contact-making tip 15 away from the surface of the photoblank 4 during the mounting by means of a suitable aid.

After the fitting of the screw connections 11, the contact-making tip 15 is lowered onto the surface of the photoblank 4 in a controlled way. In the first-mentioned case, this is carried out by the setting screw 18 being unscrewed by a defined amount from the threaded hole 17. In the process, the contact-making tip 15 is lowered onto the surface of the photoblank 4 and penetrates into the two upper layers 6 and 7 of the latter. The impressing pressure is in this case determined by the shape elasticity of the leaf spring 12, which depends on the material, the dimensioning and the optional shaping (see FIG. 3a) of the leaf spring 12, and can be predefined by varying these parameters. It has been shown that a permanent and reproducible electrical contact with the chromium layer 6 can be achieved even with relatively low pressing pressures. This is important, since, in particular in the case of thin photoblanks, undesired bending of the photoblank can occur as a result of the exertion of pressure. Provision is therefore made for the pressing pressure always to be set so low, depending on the thickness or flexural rigidity of the photoblank used, that bending of the photoblank is reliably avoided.

The second-mentioned option (lowering the contact-making tip 15 by means of an aid) offers the advantage that the setting screw 18 does not need to be rotated for this operation. By means of the exact pre-positioning of the setting screw 18, it is therefore possible for a desired final-position travel of the contact-making tip 15 to be maintained with very precise dimensions.

It is important that, in both procedures, lateral relative movement between the photoblank 4 and the contact-making tip 15 when the tip is being applied is effectively prevented.

Figure 3A:
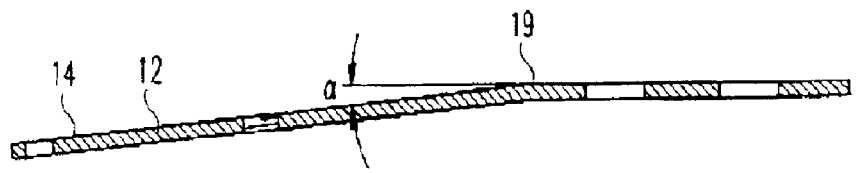
FIG. 3a is a sectional illustration of the leaf spring illustrated in FIG. 1.
Figure 3B:
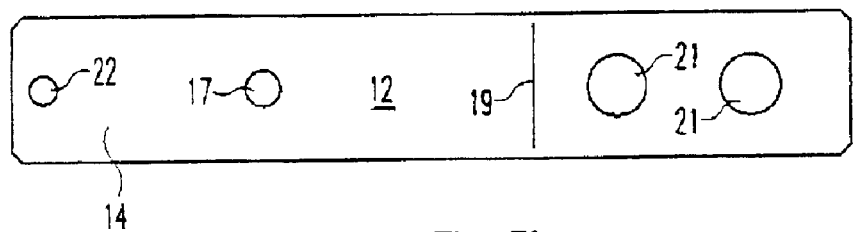

FIG. 3a shows a possible shaping of a suitable leaf spring 12 in the unstressed state. In this case, a bend 19 has been formed between the drilled holes 21 provided for the screw connections 11 and the threaded hole 17, at which bend the leaf spring 12 is bent over through an angle α of, for example, 5° with respect to its straight course. The leaf spring 12 may be formed of a CuSn alloy (bronze), for example a CuSn$_6$ alloy with a 6% proportion of tin, or of a CuBe alloy.

Figure 4A:
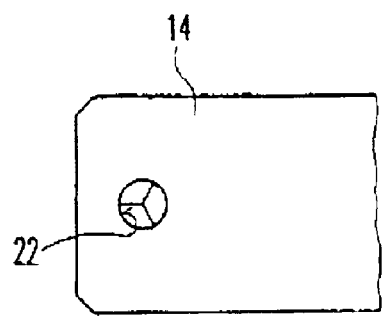
FIG. 4a is a partial plan view of the grounding spring of FIG. 1 in the area of the contact-making tip.
Figure 4B:
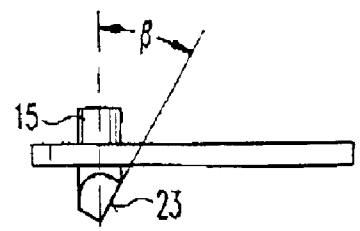

The free end 14 of the leaf spring 12 is illustrated in enlarged form in FIGS. 4a and 4b. At its free end 14, the leaf spring 12 has a hole 22 into which the pin-like contact-making tip 15 is pressed. The contact-making tip 15 can be secured in the area of the hole 22 with a conductive adhesive. As a result of the press fit and the conductive adhesive which may additionally be provided, a low-resistance electrical connection between the leaf spring 12 and the contact-making tip 15 is achieved.

The contact-making tip 15 is formed, in its forward end, as a triangular tip, the three edges in each case being arranged at an angle of 120° to one another. The tip 15 is provided with a sharp-edged and burr-free precision-ground finish. A cutting face 23 formed between two cutting edges is in this case inclined at an angle β of about 30° with respect to the mid-axis of the contact-making tip 15.

The contact-making tip 15 preferably consists of a hard metal of the GTD type, which has a high hardness and a good electrical conductivity and, in addition, does not contain any magnetic components which disrupt the beam geometry.

We claim:

1. A method of grounding a photoblank provided with an electrically conductive layer in a holding device, which comprises:

positioning the photoblank on a supporting surface of the holding device;

providing a leaf spring with a contact-making tip mounted thereon;

lowering the contact-making tip onto a surface of the photoblank in a controlled manner with a position-adjusting element, which is connected to the leaf spring and forms an adjustable stop on the holding device, by adjusting the position-adjusting element by a defined amount, whereby the contact-making tip is lowered onto the surface of the photoblank and penetrates the surface with a predetermined impressing pressure; and forming the leaf spring, in an unstressed state, with a bend at which a longitudinal extent of the leaf spring deviates by an angle α from a rectilinear course.

2. The method according to claim 1, which comprises, prior to mounting the leaf spring on the holding device, turning the position-adjusting element sufficiently far into a threaded hole formed in the leaf spring for securing a spacing.

3. The method according to claim 1, wherein the position-adjusting element is a setting screw.

4. The method according to claim 1, which comprises fixing a position of the photoblank with at least one hold-down fitted to the holding device and clamping the photoblank firmly with pressure on the surface of the photoblank.

5. The method according to claim 1, wherein the angle α is between 2° and 15°.

6. A method of grounding a photoblank provided with an electrically conductive layer in a holding device, which comprises:

positioning a photoblank on a supporting surface of a holding device;

providing a leaf spring with a contact-making tip fitted thereto;

mounting and prepositioning a position-adjusting element on the leaf spring for forming an adjustable stop on the holding device;

holding the leaf spring away from the surface of the photoblank with an element other than the position-adjusting element; and subsequently to positioning the photoblank, lowering the leaf spring onto the photoblank in a controlled manner;

whereby a final-position travel is predefined by the pre-positioned position-adjusting element.

7. The method according to claim 6, wherein the position-adjusting element is a setting screw.

8. The method according to claim 6, which comprises fixing a position of the photoblank with at least one hold-down fitted to the holding device and clamping the photoblank firmly with pressure on the surface of the photoblank.

9. The method according to claim 6, wherein, in an unstressed state, the leaf spring is formed with a bend at which a longitudinal extent of the leaf spring deviates by an angle α from a rectilinear course.

10. The method according to claim 9, wherein the angle α is between 2° and 15°.

* * * * *